United States Patent [19]

Inagawa et al.

[11] Patent Number: 5,063,280
[45] Date of Patent: Nov. 5, 1991

[54] METHOD AND APPARATUS FOR FORMING HOLES INTO PRINTED CIRCUIT BOARD

[75] Inventors: Hideho Inagawa, Yokohama; Shigenobu Nojo, Kawasaki, both of Japan

[73] Assignee: Canon Kabushiki Kaisha, Tokyo, Japan

[21] Appl. No.: 553,666

[22] Filed: Jul. 18, 1990

[30] Foreign Application Priority Data

Jul. 24, 1989 [JP] Japan .................................. 1-188971
Jun. 12, 1990 [JP] Japan .................................. 2-154685

[51] Int. Cl.$^5$ ............................................ B23K 26/00
[52] U.S. Cl. .............................. 219/121.7; 219/121.71; 219/121.78
[58] Field of Search ................... 219/121.83, 121.75, 219/121.7, 121.71, 121.73, 121.82

[56] References Cited

U.S. PATENT DOCUMENTS

| | | | |
|---|---|---|---|
| 4,088,864 | 5/1978 | Theeuwes et al. | 219/121.7 X |
| 4,263,495 | 4/1981 | Fujita et al. | 219/121.83 X |
| 4,873,414 | 10/1985 | Ma et al. | 219/121.71 X |
| 4,933,045 | 6/1990 | DiStefano et al. | 156/643 |

FOREIGN PATENT DOCUMENTS 0050190 3/1983 Japan ............................. 219/121.72

Primary Examiner—C. L. Albritton
Attorney, Agent, or Firm—Fitzpatrick, Cella, Harper & Scinto

[57] ABSTRACT

A method of forming holes into a printed circuit board whereby when a hole is formed into the printed circuit board by using an energy beam such as a laser beam or the like, a focal point position of the beam is moved with the progressing of the hole forming process. To move the focal point position of the beam with the progressing of the hole forming process when a hole is formed into the printed circuit board by using an energy beam such as a laser beam or the like, a mechanism to move a converging optical system in the direction of the optical axis is provided. Also provided is a method of checking a penetrating state of a through hole in the case where a through hole is worked into a circuit pattern portion of a printed circuit board by using an energy beam such as a laser beam and where the beam is irradiated from the surface of the printed circuit board and the material constructing the printed circuit board is fused and discharged and penetrated to the back surface, thereby forming a through hole.

4 Claims, 6 Drawing Sheets

METHOD AND APPARATUS FOR FORMING HOLES INTO PRINTED CIRCUIT BOARD

BACKGROUND OF THE INVENTION

1. Field of the Invention

The present invention relates to method and apparatus for forming holes into a printed circuit board by using an energy beam such as a laser beam or the like.

Further, the invention relates to a method of checking a penetrating state of a through hole in the case where a through hole is formed into a circuit pattern portion of a printed circuit board by using an energy beam such as a laser beam and where the beam is irradiated from the surface of the printed circuit board and the material constructing the printed circuit board is fused and discharged and penetrated to the back surface, thereby forming a through hole.

2. Related Background Art

Hitherto, when through holes are formed into a printed circuit board, a mechanical working method using a drill is used to form a hole. Particularly, as a diameter of a through hole to be worked decreases, a hole forming process is executed by using an expensive ultrahard drill having a high physical rigidity.

FIGS. 7A and 7B are diagrams showing a conventional hole forming process using a drill.

FIG. 7A is a cross sectional view of a hole showing a state in which a hole was formed into a two-sided epoxy board 6 by using a drill 9. According to this method, as shown in the diagram, random concave and convex portions are formed on the wall surface of the hole or a deviation is caused between the opening positions of the upper and lower surfaces due to the shooting of the drill. As shown in FIG. 7B, if a conductor is formed in such a through hole, the conductor cannot be uniformly formed, resulting in a cause of the occurrence of a defective conduction.

SUMMARY OF THE INVENTION

In recent years, a micro hole forming processing apparatus using an energy beam such as a laser beam or the like has been developed in consideration of the problems in the mechanical hole forming process using a drill as mentioned above.

According to the above hole forming process by using the energy beam, as a beam diameter is reduced, an energy density increases and a working area decreases, so that as a diameter of a hole which is formed by the hole forming process becomes very small, such a method is more advantageous from viewpoints of the accuracy and costs.

However, in the case of forming holes into a printed circuit board, there are problems such that an energy density is highest for a thickness of board and hole diameters on the incident side of the laser beam and the emitting side thereof or in the hole differ depending upon the position where a focal point of a small spot diameter is set. The result is that a tapered shaped hole is formed. Hole diameters on the front and back surfaces do not coincide due to a warp of the board and that results in quality problems because a corner of an acute angle is formed, stresses are concentrated in such an acute portion, the reliability lacks, and the like.

It is the first object of the invention to solve the above-mentioned problems.

When the hole forming process is progressed by a laser energy beam from a copper foil portion of a front surface of a printed circuit board through a resin portion as an intermediate layer toward a copper foil portion of a back surface portion, the copper foil portions and the resin portion are fused and discharged by the tip portion of the converged light beam.

If the irradiation of the beam is not stopped at a time point when the beam tip portion has just penetrated the printed circuit board, the copper foil portion on the upper surface or the resin portion of the through hole is fused and discharged by the extended light flux portion of the beam in the upper portion of the beam tip portion. Diameters in the upper, intermediate, and lower portions in the cross sectional shape of the through hole are not substantially equal. In the extreme case, a cross sectional shape of a frusto-conical head and the hole diameter on the upper surface increase.

As through holes having a two-sided circuit pattern of a printed circuit board, it is preferable to have a hole shape in which the diameter is uniform from the front surface to the back surface. However, if the beam irradiation is continued even after the through hole was formed by the laser, the hole of a uniform diameter cannot be obtained.

According to the invention, when a through hole is formed by irradiating a laser energy beam to the printed circuit board, in order to obtain a hole having a uniform diameter from the front surface to the back surface, it is detected that the beam has penetrated the printed circuit board, and the beam irradiation is controlled on the basis of such a detection, thereby solving the above object.

According to the invention, a sensor to measure the light of the beam is arranged around the light flux of the beam which penetrated the hole and the laser source is stopped and controlled by an output signal of the sensor, thereby preventing that the upper diameter portion of the through hole is fused.

Further, according to the invention, there is proposed a method whereby in order to check a through hole in a printed circuit board, the output power of the laser beam to form the hole is weakened and switched to a light quantity such that it can be detected by a photo sensor, thereby checking the through hole.

The above objects can be solved by a method of forming holes into a printed circuit board according to the invention, wherein when a hole is formed into the printed circuit board by using an energy beam such as a laser or the like, a focal point position of the beam is moved with the progressing of the hole forming process. The above objects can be also solved by an apparatus for forming holes into a printed circuit board, wherein when a hole is formed into the printed circuit board by using an energy beam such as a laser or the like, as means for moving a focal point position of the beam with the progressing of the hole forming process, a mechanism to move a converging optical system in the direction of an optical axis is provided.

According to the invention, the focal point position at which an energy density is highest and a beam spot diameter is minimum is moved in the progressing direction in accordance with the progressing of the process to eliminate the material to form the hole, and the converging optical system is moved in the direction of the optical axis so that the focal point is always located onto a new surface which appears due to the elimination of the material and a hole forming process in the board is executed, so that a straight hole shape without a tapered portion can be obtained. By making such a hole conductive, a printed circuit board having the through hole of a high reliability can be obtained.

Further, to achieve the second object, the invention proposes a checking method in a hole forming process of a printed circuit board, whereby when a hole is formed into the printed circuit board by using an energy beam of a laser, a beam photo sensor is arranged around the light flux of the beam which is deviated from the center line of the optical axis of the beam on the back surface side of the penetration of the beam of the printed circuit board and a hole forming state of the printed circuit board is checked by an output signal of the photo sensor. The invention also proposes a checking method in a hole forming process of a printed circuit board, whereby when a hole is formed into the printed circuit board by using an energy beam of a laser, a lens to control the light flux of the laser is made movable in the direction of the optical axis, ar output power of the laser is weakened after a hole was formed and penetrated, the laser beam of a weakened output power is detected by a photo sensor, and a penetrating state of the printed circuit board is checked.

BRIEF DESCRIPTION OF THE DRAWINGS

FIG. 3 is an explanatory diagram of a construction of an apparatus;

FIG. 4 is an explanatory diagram of a working state;

FIG. 5 is an explanatory diagram to check a penetrating state;

FIG. 6A is an explanatory diagram of a construction of an apparatus;

FIG. 6B is an explanatory diagram to check a penetrating state; and

DETAILED DESCRIPTION OF THE PREFERRED EMBODIMENTS

An embodiment of the present invention will be described hereinbelow with reference to the drawings.

Figure 1A:
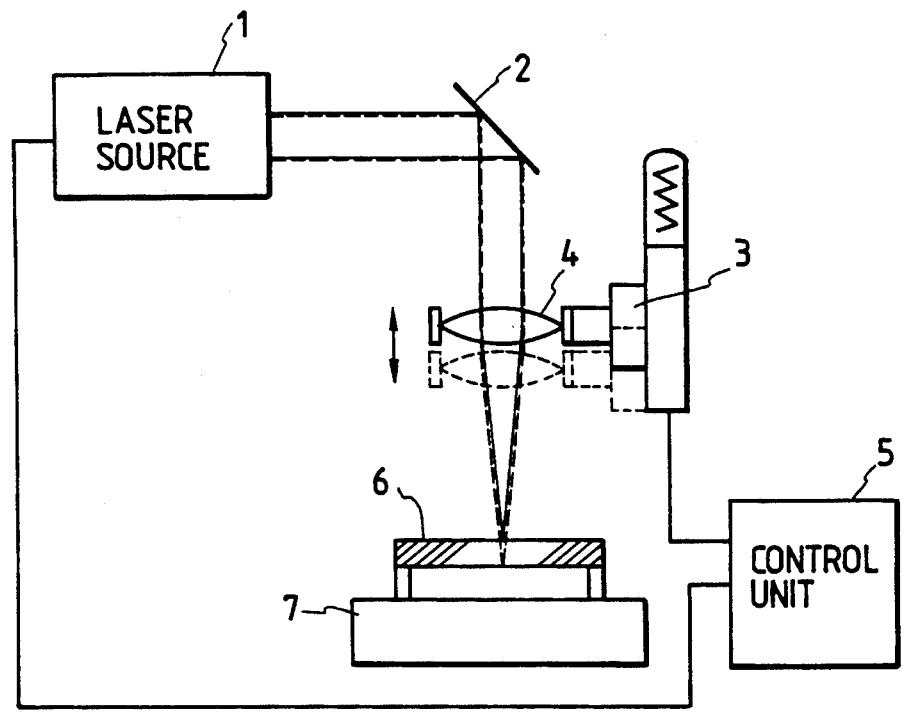
FIG. 1A is a diagram showing a fundamental construction of means for forming a hole into a printed circuit board in the first embodiment according to the invention.

FIG. 1A is a diagram showing a fundamental construction of means for forming a hole into a printed circuit board in an embodiment according to the invention.

In the diagram, reference numeral 1 denotes a laser source. In the embodiment, a pulse oscillation by a carbon dioxide laser ($\lambda = 10.6$ $\mu$m) or an excimer laser (KrF, $\lambda = 248$ nm) is used. A laser beam generated from the laser source 1 is reflected by a total reflecting mirror 2 and passes through a condenser lens 4 and is focused to the workpiece 6 (glass-epoxy material for a printed circuit board: TLC-W-551, made by Toshiba Chemicals Co., Ltd.), thereby forming a hole into the workpiece.

In the diagram, reference numeral 7 denotes a stage (X-Y table) to hole the board.

In the embodiment, the condenser lens 4 is attached to a Z-axis stage 3 equipped with a pulse motor. The stage 7 is further controlled by a focusing and laser oscillation control unit 5. A signal to start the laser oscillation and a signal to start the descending operation of the pulse motor stage are generated from the control unit 5. The condenser lens 4 descends interlockingly with the laser oscillation, so that a focal point of the laser beam obtained by the condenser lens 4 is set to the working position and a hole can be formed.

Figure 1B:
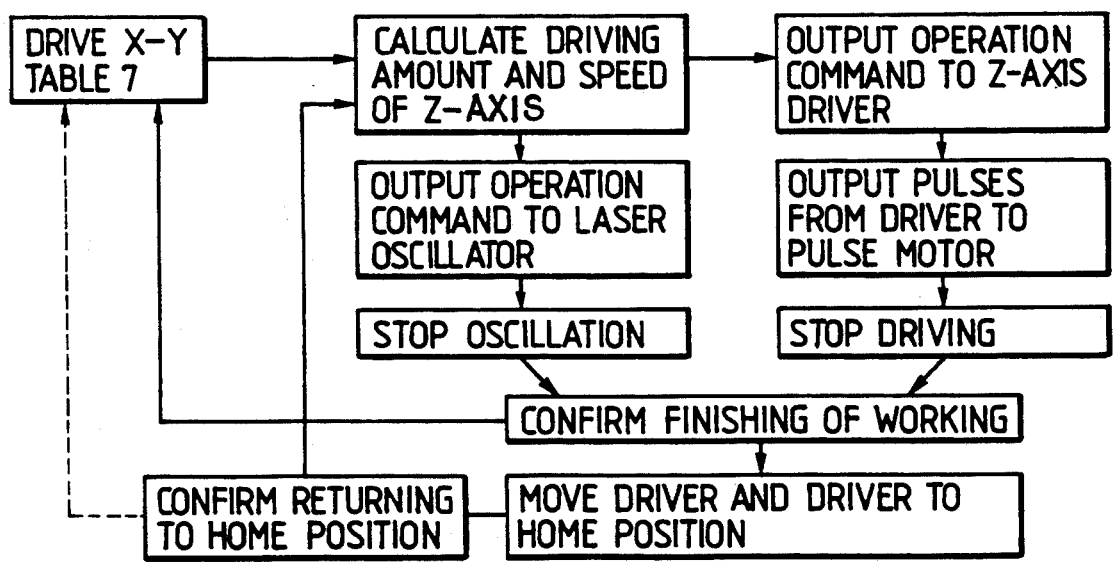
FIG. 1B is a block diagram for the control regarding the apparatus shown in FIG. 1A.

FIG. 1B is a block diagram showing the operation of the apparatus shown in FIG. 1A.

First, as shown in the block diagram, the coordinates of the X-Y table of the stage 7 are moved and the workpiece (board) 6 is set to the focal point position cf the laser beam. Further, a movement amount in the Z-axis direction to set the working surface of the workpiece 6 to the focal point on the Z axis is calculated by a control computer (computer to actuate the stage; not shown) and a command is given to a driver unit of the Z-axis stage. Thus, pulses are output to a pulse motor (not shown) to drive in the Z-axis direction, thereby moving the Z-axis stage to the calculated position in the Z-axis direction. After that, the driver unit is stopped.

After completion of the control regarding the X, Y and Z axes by the control computer, a beam output command is generated from the control unit 5 to the laser source 1. The laser beams of a predetermined number of pulses is output to execute the hole forming process. After it was confirmed by the control computer that the predetermined number of pulses had been oscillated, the stage 7 is returned to the home position or saved position. Thereafter, the workpiece 6 is removed from the stage 7.

Figure 1C:
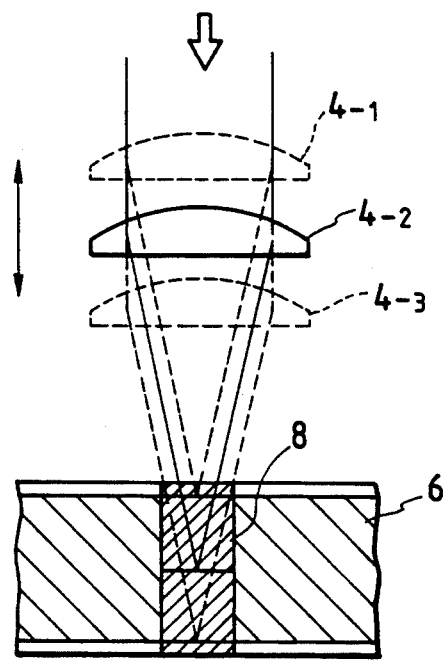
FIG. 1C is a schematic diagram showing a state in which a hole is formed by the hole forming method shown in FIG. 1A.

FIG. 1C schematically illustrates a hole forming process in FIGS. 1A and 1B. First, the condenser lens 4 is located at a position 4-1 and a focal point is located on the surface of the board 6. With the progressing of the hole forming process, the lens 4 is moves from a position 4-2 (focal point is located near the center in the thickness direction of the board 6) to a position 4-3 (focal point is located on the back surface of the board 6) by the control unit 5. Due to this, the center of the beam spot is always located on the working surface, so that a uniform straight through hole 8 is obtained.

In the embodiment, although a laser beam such as a $CO_2$ laser, excimer laser, or the like has been used as an energy source which is used for the hole forming process, other energy beams such as electron beam, ion beam, or the like can be also used. In the embodiment, the focal point position has been moved by moving the optical system (mainly, condenser lens) in the optical axis direction. However, a focal distance can be also changed by adjusting a thickness of lens. Further, although the working by the embodiment has been limited to the hole forming process the invention can be also applied to other workings such as cutting, welding, and the like.

Comparison example

Figure 2:
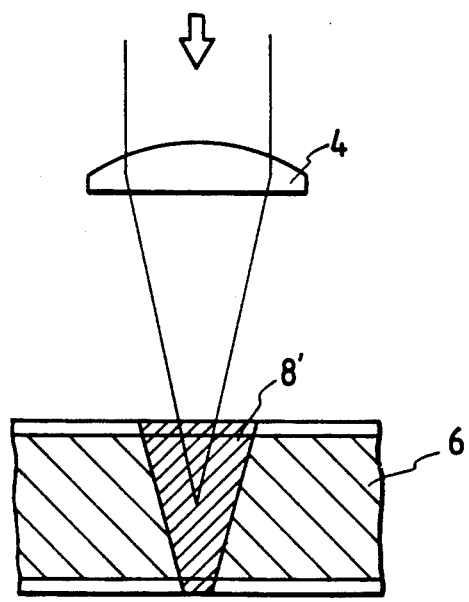
FIG. 2 is a schematic cross sectional view showing a comparison example of an embodiment according to the invention.
Figure 7A:
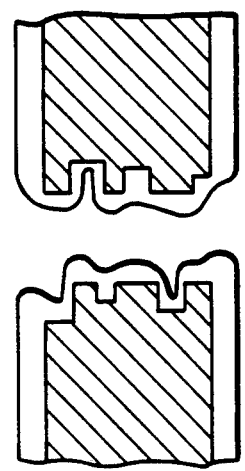
FIGS. 7A and 7B are diagrams showing a conventional hole forming method using a drill.
Figure 7B:
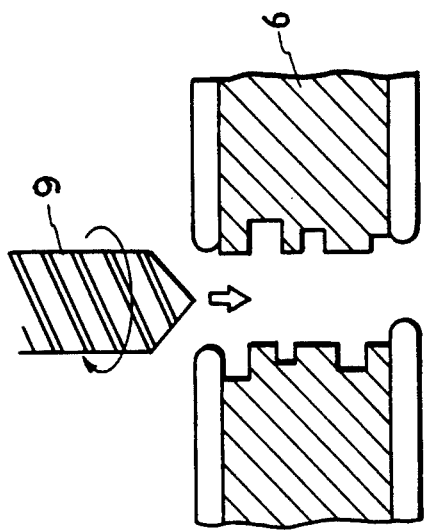

FIG. 2 shows a process in the case where the lens is fixed and the focal point position is fixed as in the conventional one as a comparison example of the above embodiment. It will be understood that a tapered hole 8' is easily formed by the method in the comparison example.

As described above, the position of the focal point at which the energy density is highest and the beam spot is minimum is moved with the progressing of the hole forming process in the depth direction of the hole forming surface, so that a straight hole shape is obtained and a through hole shape of a high reliability can be obtained.

Description of the embodiment

Figure 3:
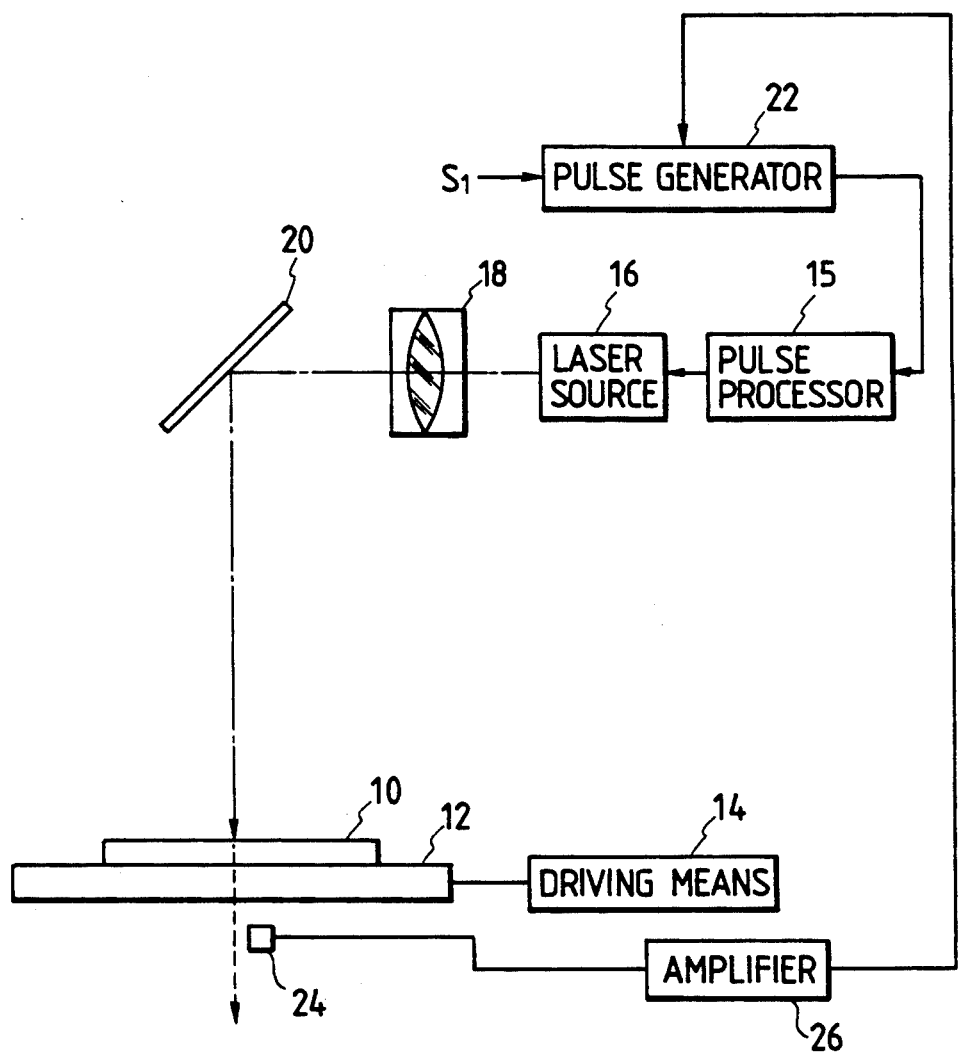
FIGS. 3 to 5 show the first embodiment.
Figure 4:
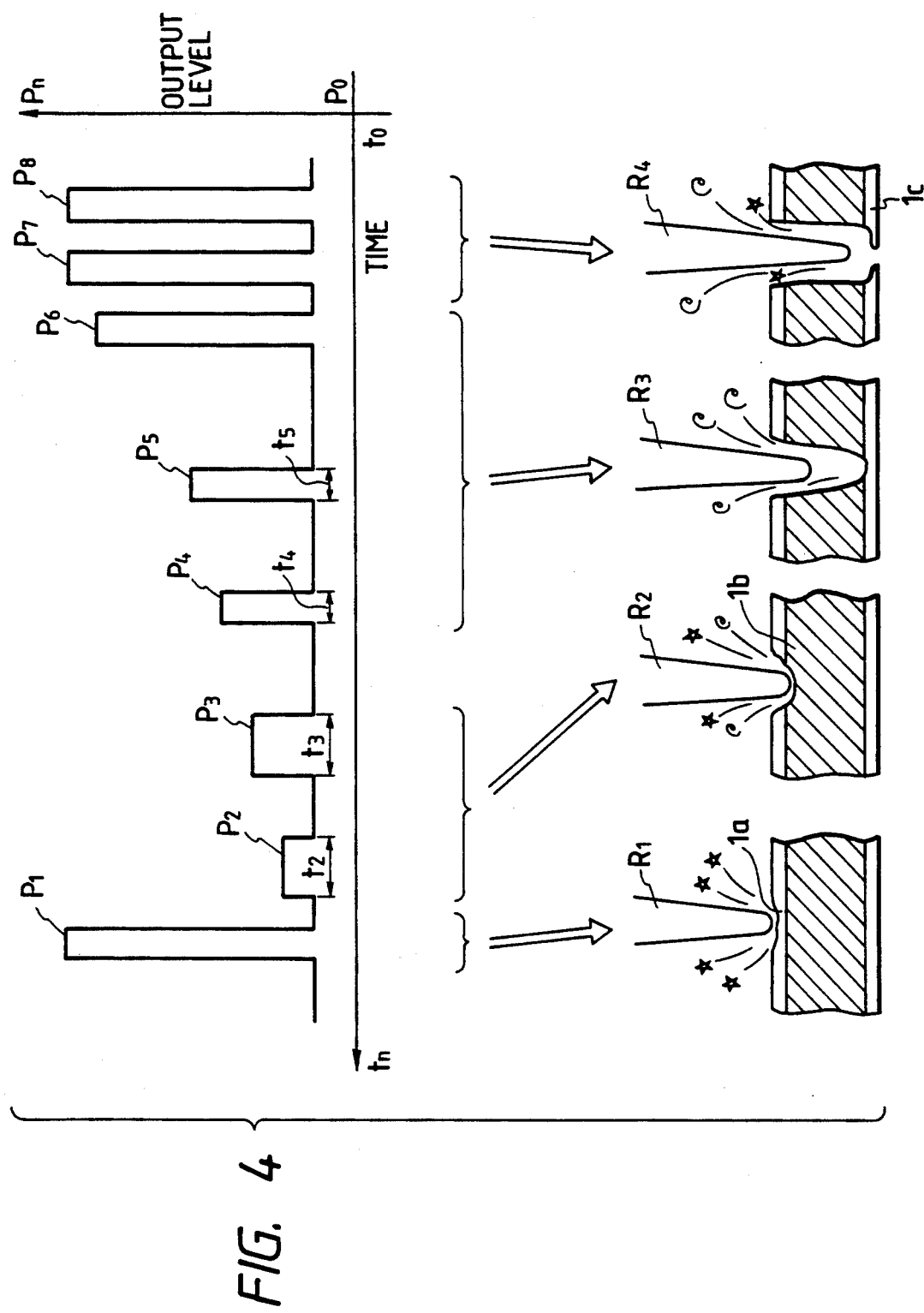
Figure 5:
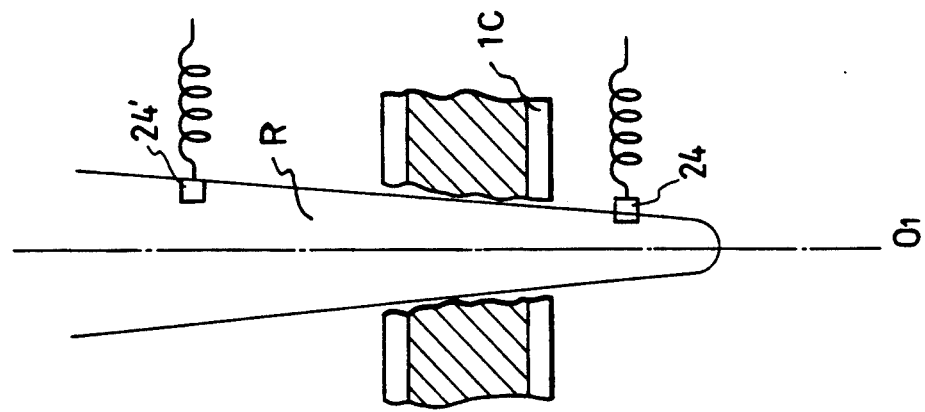

FIGS. 3 and 4 show the second embodiments of the invention. FIG. 3 is a diagram showing a construction of an apparatus for executing the method of the invention. FIG. 4 is a pulse waveform diagram of a laser output in the embodiment. FIG. 5 is a diagram showing a working state. In the diagrams, reference numeral 10 denotes a printed circuit board to be worked; 12 an X-Y table stage which holds the board 10 and can move the board 10 in the directions of the X and Y axes for a predetermined plane; and 14 a driving means such as a motor or the like for driving the X-Y table stage 12.

Reference numeral 16 denotes a first laser source for generating a first laser beam in a long wavelength range such as a $CO_2$ gas laser or the like; 18 an optical system to control the light flux of the first laser beam; 20 a reflecting mirror for changing the optical path of the laser beam which passed through the optical system 18 to the working surface of the printed circuit board 10; and 22 a pulse generator to output exciting pulses to drive and excite the first laser source 16.

The pulse generator 22 outputs pulses of a predetermined duty ratio. Reference numeral 15 denotes processing means for processing the output pulses from the first pulse generator 22. The processing means 15 receives the pulse signal from the pulse generator 22 and processes it into a signal as shown in FIG. 4. Reference numeral 24 denotes a photo sensitive device to detect the light of the bean. As shown in FIG. 5, the photo sensitive device 24 is arranged at a position such as to detect the peripheral light of the light flux which penetrated a copper foil portion 1C of the back surface of the printed circuit board by a beam R. Reference numeral 26 in FIG. 3 denotes an amplifier for amplifying a signal from the photo sensitive device 24 and outputting a signal to inhibit the pulse generation to the pulse generator 22.

The working state will now be described with reference to FIGS. 4 and 5.

When driving pulses of a predetermined period are output from the pulse generator by a driving signal $S_1$, the processing means 15 outputs exciting pulses of the laser source as shown in FIG. 4 by the reception of the driving pulses. For the exciting pulses, a time base is set from the right to the left on an axis of abscissa and an output level of the exciting pulse is set to an axis of ordinate.

In the exciting pulses in FIG. 4, when the driving pulse is first input to the processing means, an exciting pulse $P_1$ of a large output is generated. The large exciting pulse $P_1$ is a pulse to form a hole into the copper foil portion of the surface of the printed circuit board. The number of exciting pulses $P_1$ is properly set to one or a plural number. After the large exciting pulse was output, as shown in FIG. 4, a plurality of low output pulses $P_2$ to $P_6$ are output. The low output waveform pulses $P_2$ to $P_6$ are exciting pulses to work the portion of the resin material under the copper foil portion of the front surface after they penetrated the copper foil portion of the surface of the printed circuit board.

As shown in FIG. 4, the exciting pulses $P_2$ to $P_6$ to work the resin portion are set so as to gradually increase the pulse outputs and to gradually reduce the pulse widths.

After completion of the generation of the pulses of the number which penetrate the resin portion by the low output exciting pulses $P_2$ to $P_6$ to work the resin portion, large output exciting pulses $P_7$, $P_8$, . . . which are similar to the initial oscillating pulses $P_1$ are output. The large output exciting pulses $P_7$, $P_8$, . . . are used to work the copper foil portion of the back surface of the printed circuit board. When the exciting pulses $P_1$ to $P_8$ shown in FIG. 4 mentioned above are output from the pulse processing means 15 and the first laser source 16 is excited, a laser beam of a period and an output corresponding to the pulse waveform shown in FIG. 4 is generated from the laser source 16. The laser team is reflected by the reflecting mirror 20 and irradiated onto the printed circuit board 10 on the X-Y stage table 12.

The pulses $P_1$ to $P_8$ shown in FIG. 4 are generated from the laser source 16 by the pulse processing means 15 and a through hole is formed in the printed circuit board. After the hole was penetrated, the laser beam passes through the through hole and is irradiated and enters the photo sensitive device 24 arranged at the position such as to detect the peripheral light flux of an optical axis $O_1$ of the beam.

The photo sensitive device 24 receives the incident light and outputs an electric signal. The electric signal is input to the amplifier 26. The amplified signal from the amplifier 26 is input to the pulse generator 22 and the operation to inhibit the pulse generation is performed, so that the laser output is stopped.

In the embodiment, the photo sensitive device has been arranged on the through hole side (back surface side) of the printed circuit board. However, as shown by reference numeral 24' in FIG. 5, the photo sensitive device can be also arranged above the printed circuit board and the weak peripheral light of the beam light flux can be also detected.

The third embdodiment of the invention will now be described with reference to the drawings.

Figure 6B:
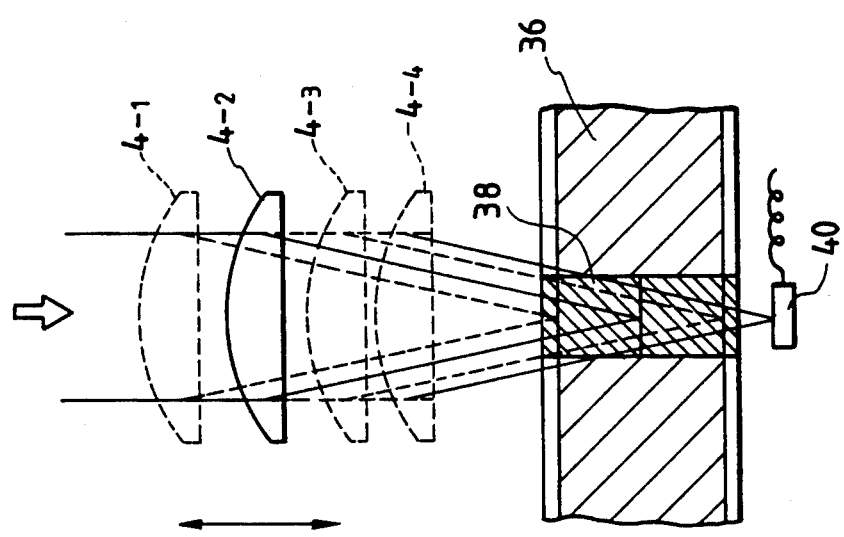
FIGS. 6A and 6B show the third embodiment.
Figure 6A:
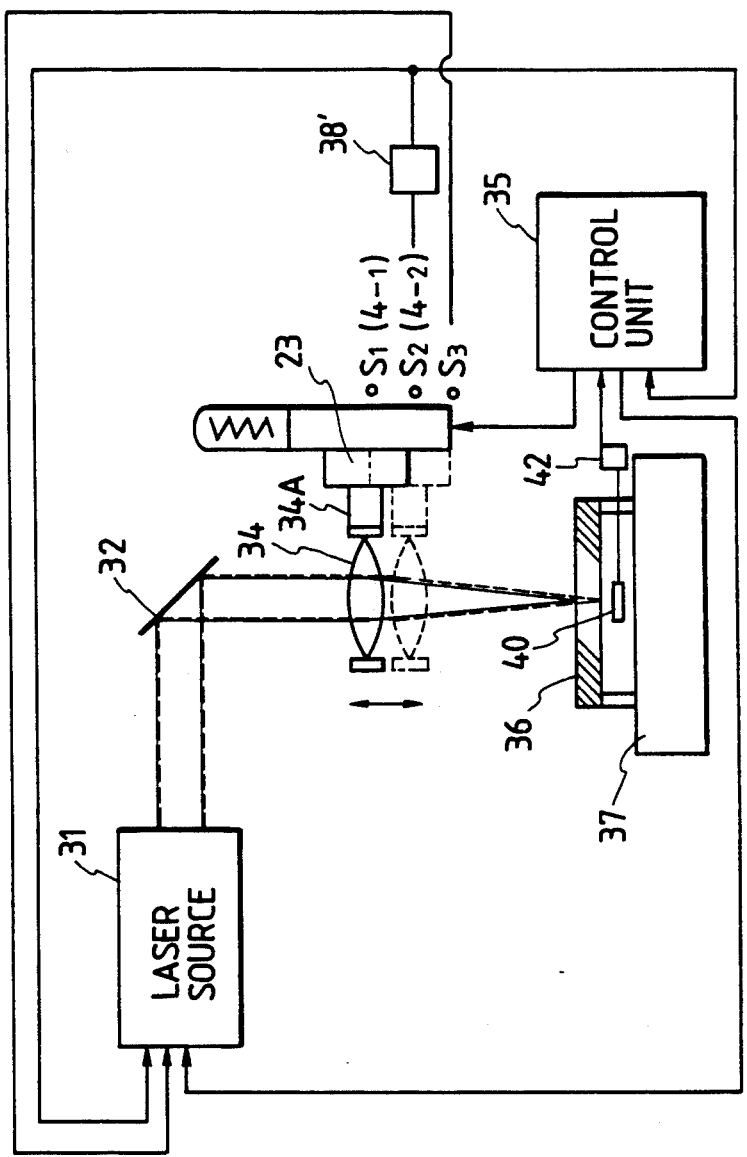

FIG. 6A is a diagram showing a fundamental construction of means for forming holes into a printed circuit board of the embodiment according to the invention.

In the diagram, reference numeral 31 denotes a laser source. In the embodiment, a pulse oscillation by a $CO_2$ laser ($\lambda = 10.6$ $\mu$m) or an excimer laser (KrF: $\lambda = 248$ nm) is used. A laser beam generated from the laser source 31 is reflected by a total reflecting mirror 32 and passes through a condenser lens 34 and is focused onto a workpiece 36 (glass-epoxy material for a printed circuit board: TLC-W-551, made by Toshiba Chemicals Co., Ltd.), thereby forming a hole into the workpiece. In the diagram, reference numeral 37 denotes a stage to hold the board.

In the embodiment, the condenser lens 34 is attached to a Z-axis stage 33 equipped with a pulse motor. The stage 37 is further controlled by a focusing and laser oscillation control unit 35. In the embodiment, a signal to start the laser oscillation and a signal to start the descending of the pulse motor stage are output from the control unit 35. Since the condenser lens 34 descends interlockingly with the laser oscillation, a focal point of the laser beam obtained by the condenser lens 34 is set to the working position, so that a hole can be formed.

FIG. 6B schematically shows a hole forming state in the above apparatus. First, the condenser lens 34 is located at the position 4-1 and the focal point is located on the surface of the board 36. As the working advances, the lens 34 is moved from the position 4-2 (the focal point is located near the center in the thickness direction of the board 36) to the position 4-3 (the focal point is located on the back surface of the board 36) by the control unit 35. Due to this, the center of the beam spot is always located on the working surface, so that a uniform straight through hole 38 can be obtained.

Position detecting sensors $S_1$, $S_2$ and $S_3$ are arranged near the Z-axis stage 33. The sensor $S_1$ detects the start position (4-1) of a holding member 34A of the lens 34. The sensor $S_2$ detects the penetrating position shown in FIG. 6B. The sensor $S_2$ outputs a detection signal to an amplifier $38_1$. When the amplifier $38_1$ receives the signal from the sensor $S_2$, the amplifier $38_1$ outputs a signal to the laser source 31 and control unit 35.

When the laser source 31 receives the signal from the amplifier $38_1$, the output of the laser beam is weakened and the operating mode is switched so as to generate a laser to check the penetration. On the basis of the signal from the amplifier $38_1$, the control unit 35 further descends the lens 34 until a position 4-4 shown in FIG. 6B. When the sensor $S_3$ outputs a confirmation signal of the lens descending position, the laser beam of a weakened output is generated in response to the signal of the sensor $S_3$. A photo sensitive device 40 to detect the beam light of the weakened output is arranged below the printed circuit board 36 as shown in FIG. 6B.

The photo sensitive device 40 which detected the weak light confirms the penetrating state of the printed circuit board 36 and outputs a detection signal. The signal of the device 40 is amplified by an amplifier 42. After that, the amplified signal is sent to the control unit 35, thereby stopping the laser oscillation.

As described above, according to the invention, the penetrating state is checked by using the photo sensitive device and the laser generation is stopped after the penetration was confirmed, so that a through hole having a uniform diameter can be obtained.

Further, according to the invention, since there is proposed the method whereby the output of the laser to form hole is switched to a weak light quantity and the penetrating state can be confirmed, the penetration can be accurately confirmed.

What is claimed is:

1. A method of forming holes into a printed circuit board, comprising the steps of:
    irradiating a hole to be formed in a printed circuit board with an energy beam;
    pulsating the energy beam irradiating the hole to be formed; and
    moving a focal point of the energy beam so it is focused in a new working surface in the hole as the hole forming process progresses.

2. A confirming method in a hole forming process of a printed circuit board wherein when a hole is formed into a printed circuit board by using a laser energy beam, the steps are comprised of:
    arranging a beam photo sensitive device at a position proximate to a back surface side of the printed circuit board to receive light flux of the beam, with the position being deviated from a center line of an optical axis of the beam;
    confirming a hole forming state of the printed circuit board by an output signal of the photo-sensitive device; and
    reducing an output of the laser to thereby obtain a beam light to confirm a through hole.

3. A confirming method in a hole forming process of a printed circuit board, wherein when a hole is formed into a printed circuit board by using a laser energy beam, the steps are comprised of:
    moving a lens to control a light flux of the laser in the direction of an optical axis;
    reducing an output of the laser after the hole is formed and penetrated;
    detecting the laser beam of the reduced output with a photo-sensitive device; and
    confirming a penetrating state of the printed circuit board.

4. An apparatus for forming holes into a printed circuit board by a laser beam, comprising:
    means for holding the printed circuit board;
    means for irradiating the laser beam to a hole forming position on the printed circuit board; and
    means for confirming a penetrating state of the printed circuit board, wherein said confirming means has means for switching an output of said irradiating means and executes a control so as to reduce the output in order to confirm the penetrating state.

* * * * *

UNITED STATES PATENT AND TRADEMARK OFFICE
CERTIFICATE OF CORRECTION

PATENT NO. : 5,063,280
DATED : November 5, 1991
INVENTOR(S) : Hideho Inagawa, et al.

It is certified that error appears in the above-identified patent and that said Letters Patent is hereby corrected as shown below:

TITLE PAGE:

[56] REFERENCES CITED

U.S. PATENT DOCUMENTS, "4,873,414  10/1985  Ma et al." should read --4,873,414  10/1989  Ma et al.--.

COLUMN 2:

Line 34, "cf" should read --of--.

COLUMN 3:

Line 19, "ar" should read --an--.

COLUMN 4:

Line 17, "cf" should read --of--.

COLUMN 5:

Line 37, "bean." should read --beam.--.

COLUMN 6:

Line 17, "team" should read --beam--.

UNITED STATES PATENT AND TRADEMARK OFFICE
CERTIFICATE OF CORRECTION

PATENT NO. : 5,063,280

DATED : November 5, 1991

INVENTOR(S) : Hideho Inagawa, et al.

It is certified that error appears in the above-identified patent and that said Letters Patent is hereby corrected as shown below:

Line 21, "mean:" should read --means--.

Signed and Sealed this

Thirteenth Day of April, 1993

Attest:

STEPHEN G. KUNIN

Attesting Officer

Acting Commissioner of Patents and Trademarks